US 7,961,122 B1

(12) United States Patent
Lin

(10) Patent No.: US 7,961,122 B1
(45) Date of Patent: Jun. 14, 2011

(54) MULTI-BIN CABAC BYPASS BIN DECODER

(75) Inventor: Chien-Chang Lin, Tainan County (TW)

(73) Assignee: Himax Media Solutions, Inc., Tainan (TW)

( * ) Notice: Subject to any disclaimer, the term of this patent is extended or adjusted under 35 U.S.C. 154(b) by 12 days.

(21) Appl. No.: 12/699,818

(22) Filed: Feb. 3, 2010

(51) Int. Cl.
*H03M 7/00* (2006.01)
(52) U.S. Cl. .......................................... 341/107; 341/50
(58) Field of Classification Search .................... 341/50, 341/51, 107
See application file for complete search history.

(56) References Cited

U.S. PATENT DOCUMENTS

| | | | |
|---|---|---|---|
| 7,262,722 B1 | 8/2007 | Jahanghir | |
| 7,385,535 B2 * | 6/2008 | Yang et al. | 341/107 |
| 7,777,654 B2 * | 8/2010 | Chang | 341/107 |
| 2009/0089549 A1 * | 4/2009 | Liu et al. | 712/208 |

\* cited by examiner

*Primary Examiner* — Peguy JeanPierre
(74) *Attorney, Agent, or Firm* — Winston Hsu; Scott Margo

(57) ABSTRACT

A parallel based 5 bypass bin CABAC decoder may include a 3 bypass bins decoder appropriately coupled to a 2 bypass bins decoder. The 3 bypass bins decoder may have a first input receiving a bitstream, a second input receiving range values, a first output outputting a first bypass bin, a second output outputting a second bypass bin, a third output outputting a third bypass bin, and a fourth output outputting a shifted bitstream to the 2 bypass bins decoder. The 2 bypass bins decoder may have a first input to receive the shifted bitstream, a second input to receive the range values, a first output outputting a fourth bypass bin, and a second output outputting a fifth bypass bin.

17 Claims, 5 Drawing Sheets

MULTI-BIN CABAC BYPASS BIN DECODER

BACKGROUND OF THE INVENTION

1. Field of the Invention

The present application relates generally to CABAC decoders, and more specifically to a multi-bin CABAC bypass bin decoder.

2. Description of the Prior Art

The Context-adaptive Binary Arithmetic Coding (CABAC) decoding algorithm is basically sequential computations to calculate range, offset, and lookup tables for context variables. The data dependence of CABAC decoding makes it difficult to achieve high decoding throughput resulting in the CABAC decoding complexity required to process high definition images in real time to be about 3 giga-operations per second. Basically, a CABAC decoder includes a decision bin decoder and a bypass bin decoder. By experiment, 80%-90% of all bins are encoded as decision bins, and the remaining bins are encoded as bypass bins. Unlike other video coding tools in H.264/AVC, although it has been done as disclosed in U.S. Pat. No. 7,262,722 issued to Jahanghir et al. and included herein in its entirety by reference, it is difficult to enhance the CABAC decoding using a parallel architecture to improve the performance. Therefore, due to the sequential order decoding, the CABAC decoding becomes a major bottleneck in H.264/AVC.

SUMMARY OF THE INVENTION

A parallel based 5 bypass bin CABAC decoder may include a 3 bypass bins decoder appropriately coupled to a 2 bypass bins decoder. The 3 bypass bins decoder may have a first input receiving a bitstream, a second input receiving range values, a first output outputting a first bypass bin, a second output outputting a second bypass bin, a third output outputting a third bypass bin, and a fourth output outputting a shifted bitstream to the 2 bypass bins decoder. The 2 bypass bins decoder may have a first input to receive the shifted bitstream, a second input to receive the range values, a first output outputting a fourth bypass bin, and a second output outputting a fifth bypass bin.

The 3 bypass bins decoder may further include a first circuit having the first input, a first adder, a first multiplexer, and the first output coupled in series and a second circuit parallel to the first circuit and having the second input, the first adder, the first multiplexer, and the first output coupled in series. A third circuit may be included where the first input, a second multiplexer, a third multiplexer, and the second output coupled in series and the third multiplexer is controlled by output of the first multiplexer. A fourth circuit parallel to the third circuit that has the second input, a second adder, the second multiplexer, the third multiplexer, and the second output coupled in series where the second multiplexer is controlled by output of the second adder, a fifth circuit parallel to the third circuit that has the first input, a third adder, a fourth multiplexer, the third multiplexer, and the second output coupled in series and a sixth circuit parallel to the third circuit that has the second input, a fourth adder, the fourth multiplexer, the third multiplexer, and the sixth output coupled in series where the fourth multiplexer is controlled by output of the fourth adder may also be included. A seventh circuit that has the first input, a fifth multiplexer, a sixth multiplexer, a seventh multiplexer and the third output coupled in series and an eighth circuit parallel to the seventh circuit that has the first input, a fifth adder, an eighth multiplexer, a ninth multiplexer, the seventh multiplexer, and the third output coupled in series where the third multiplexer, the fifth multiplexer, and the ninth multiplexer of the 3 bypass bins decoder are each controlled by a same signal may be included.

The 2 bypass bins decoder may include a first circuit that has the first input, a first adder, a first multiplexer, and the first output coupled in series, a second circuit parallel to the first circuit that has the second input, the first adder, the first multiplexer, and the first output coupled in series, and a third circuit having the first input, a second multiplexer, a third multiplexer, and the second output coupled in series where the third multiplexer is controlled by output of the first multiplexer.

The 2 bypass bins decoder may also include a fourth circuit parallel to the third circuit that has the second input, a second adder, the second multiplexer, the third multiplexer, and the second output coupled in series where the second multiplexer is controlled by output of the second adder, a fifth circuit parallel to the third circuit formed of the first input, a third adder, a fourth multiplexer, the third multiplexer, and the second output coupled in series, and a sixth circuit parallel to the third circuit having the second input, a fourth adder, the fourth multiplexer, the third multiplexer, and the sixth output coupled in series where the fourth multiplexer is controlled by output of the fourth adder.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
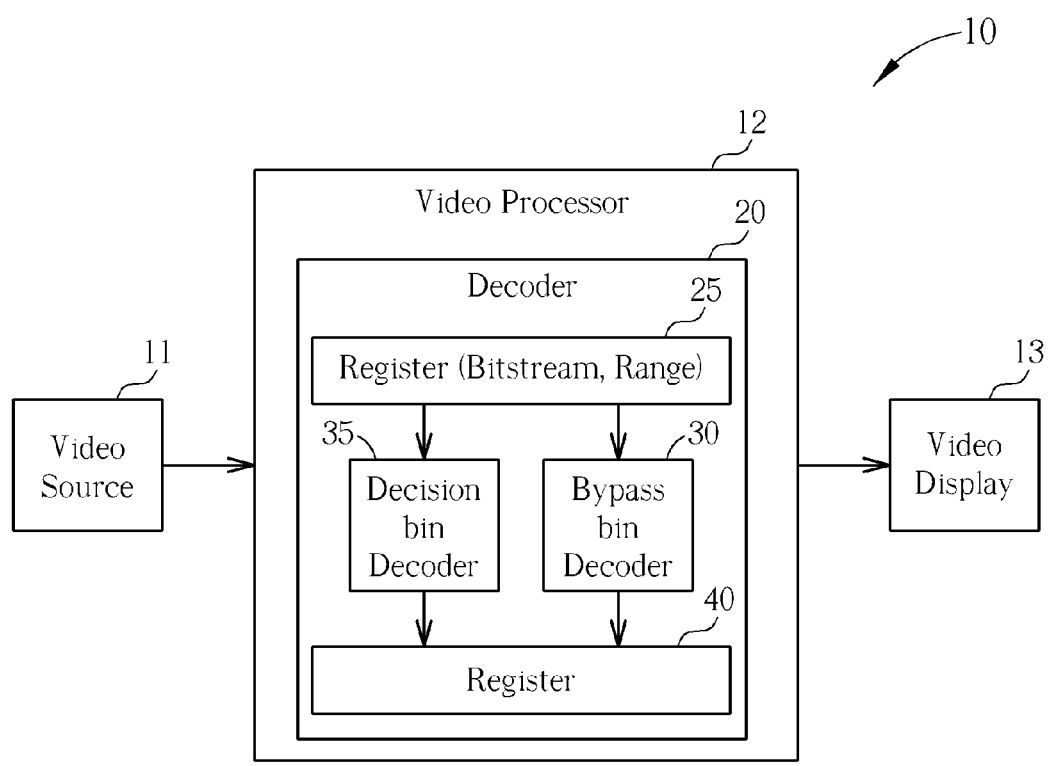
FIG. 1 is a block diagram of a video processing system.

FIG. 1 is a block diagram of a video processing system 10 suitable to take advantage of the multi-decision bin decoder disclosed herein. The video processing system 10 includes a video source 11, which may be a reproduced or transmitted video signal that may have been compressed and/or encoded using the well known H.264/AVC standard employing context-based adaptive binary arithmetic coding (CABAC) techniques. The H.264/AVC signal may be output from the video source 11 to a video processor 12 for decoding and reassembly into the original video signal before being output by the video processor 12 to a video display 13 for viewing.

The video processor 12 may include a processor for controlling operations of the video processor 12, a decoder 20 for performing the actual decoding of the inbound video signal, and a memory for temporary storage of the video signal, as storage for data and/or lookup tables used internally during the decoding process, and for use as a workspace, as well as necessary busses and connections between the components. The decoder may comprise one or more registers 25, 40, a decision bin decoder 35, and a bypass bin decoder 30.

Figure 2:
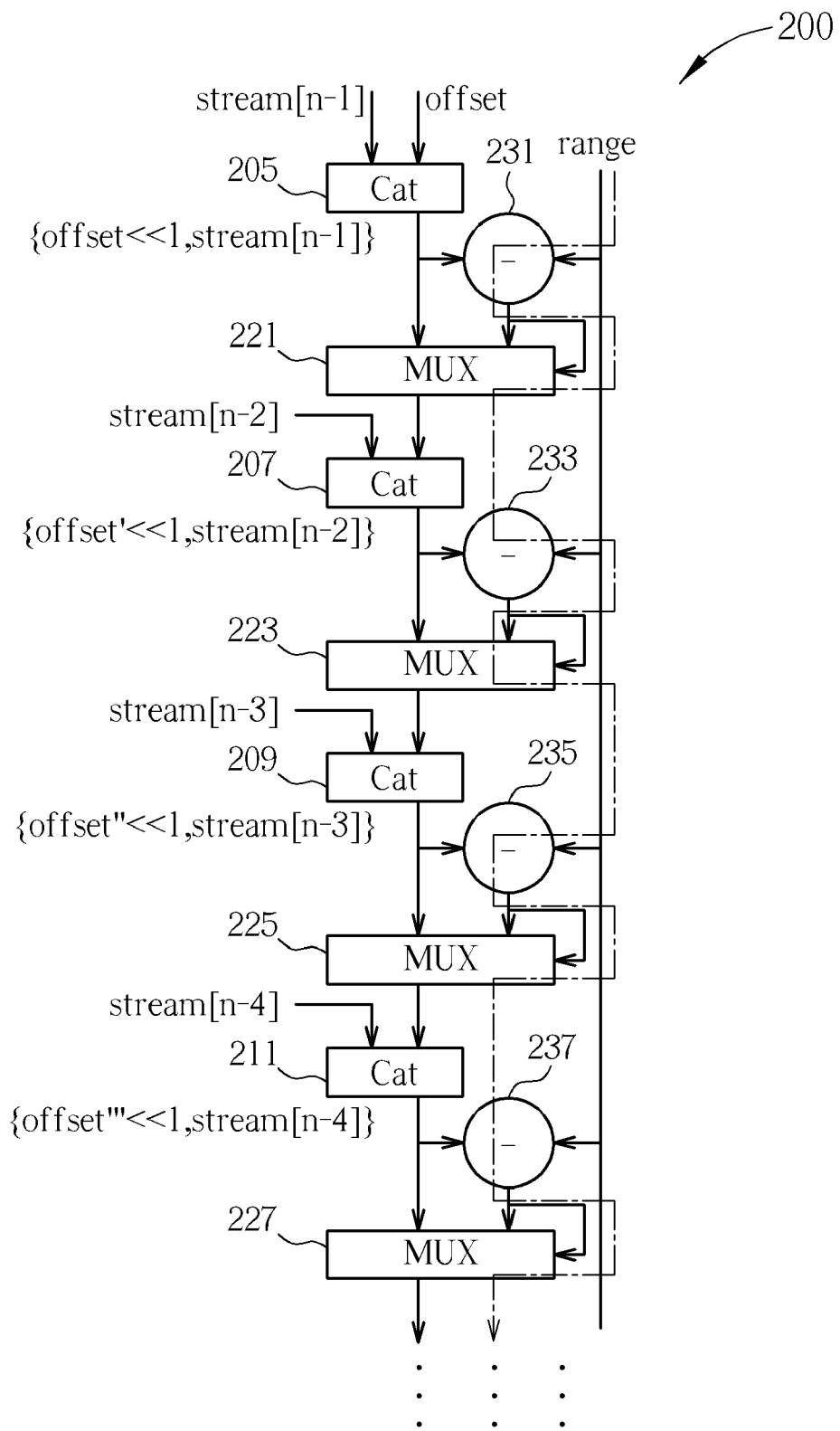
FIG. 2 illustrates a serial based bypass bin decoder for use in the video processing system of FIG. 1.

FIG. 2 illustrates a serial based bypass bin decoder 200 suitable for use in the video processing system of FIG. 1. In FIG. 2, the current offset is concatenated by a first CAT module 205 with element n-1 of the bitstream resulting is a first result comprising the shifted offset and element n-1 of the bitstream which is output as a first input to a first multiplexer 221. A first adder 231 subtracts an inputted range from the first result with the ensuing first difference output as a second input to the first multiplexer 221, and also as a control signal for the first multiplexer 221. Output of the first multiplexer 221 is fed to a second CAT module 207 where it is concatenated with element n-2 of the bitstream resulting in a second result that is transmitted as input to a second multiplexer 223. The first multiplexer 221 outputs the first difference to a second adder 233 where it is subtracted from the second result with the subsequent second difference sent as input and also as a control signal to the second multiplexer 223. The second multiplexer 223 outputs to a third CAT module 209 where the output is concatenated with element n-3 of the bitstream resulting in a third result that is transmitted as input to a third multiplexer 225. The second multiplexer 223 outputs the second difference to a third adder 235 where it is subtracted from the third result with the resulting third difference sent as input and also as a control signal to the third multiplexer 225.

The third multiplexer 225 outputs to a fourth CAT module 211 where the output is concatenated with element n-4 of the bitstream resulting in a fourth result that is transmitted as input to a fourth multiplexer 227. The third multiplexer 225 outputs the third difference to a fourth adder 237 where it is subtracted from the fourth result with the ensuing fourth difference sent as input and also as a control signal to the fourth multiplexer 227.

One skilled in the art readily understands that the serial process shown in FIG. 2 could be extended indefinitely according to design considerations but should also understand that the number of bypass bins decoded per cycle is directly related to the length of the illustrated serial chain as shown by the critical path illustrated as a broken line in FIG. 2.

Figure 3:
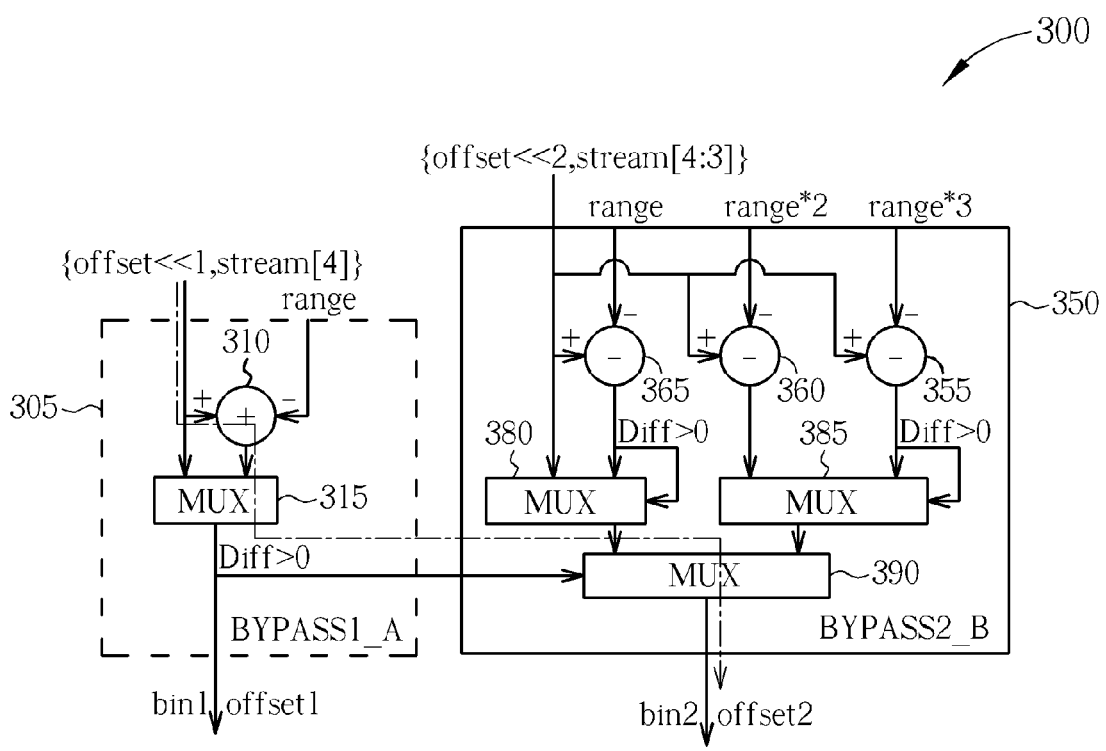
FIG. 3 shows a parallel based 2 bypass bin decoder according to some embodiments.

Please refer now to FIG. 3 which shows a parallel based 2 bypass bin decoder 300 according to some embodiments. As FIG. 3 shows, the parallel based 2 bypass bin decoder 300 in general comprises a BYPASS1_A module 305 working in concert with a BYPASS2_B 350 module to achieve the 2 bypass bin-per-cycle result.

BYPASS1_A module 305 takes a shifted offset value concatenated with the fourth element of the bitstream as input to a multiplexer 315 and an adder 310. The adder 310 takes the current range value, subtracts it from the concatenated value, and outputs the difference as input to the multiplexer 315. Outputs of the multiplexer 315 are the values of bin 1 and offset 1.

BYPASS2_B 360 takes a twice shifted offset value concatenated with the third and fourth elements of the bitstream as an input to a multiplexer 380 and a first input to a first adder 365. The range is input into the adder 365 where it is subtracted from the first input of the first adder 365 and the resulting first difference is transmitted to the multiplexer 380 as both an input and as a control signal, with output of the multiplexer 380 switching according to whether the first difference is greater than a predetermined value, such as zero. Two bits of the range are inputted to a second adder 360 where they are subtracted from the twice shifted offset value concatenated with the third and fourth elements of the bitstream, resulting in a second difference that is output as input to a multiplexer 385. Three bits of the range are inputted to a third adder 355 where they are subtracted from the twice shifted offset value concatenated with the third and fourth elements of the bitstream, resulting in a third difference that is output as both as input to, and as a control signal for, the multiplexer 385 with output of the multiplexer 380 switching according to whether the first difference is greater than a predetermined value, such as zero. Outputs of the multiplexer 380 and the multiplexer 385 are each inputted to a multiplexer 390 which is controlled according to whether output of the multiplexer 315 of BYPASS1_A module 305 is greater than a predetermined value, such as zero. As a result, the multiplexer 390 outputs bin 2 and offset2.

The design concepts of a 2 bypass bin decoder and a 3 bypass bin decoder are the same. According to the equation:

$$\text{Off1} = \text{offset} <<1 + \text{stream}[4] \text{ or offset} <<1 + \text{stream}[4] - \text{range} \quad (1)$$

$$\text{Off2} = \text{Off1} <<1 + \text{stream}[3] \text{ or Off1} <<1 + \text{stream}[3] - \text{range} \quad (2)$$

Replace Off1 to equation 2, then $$\text{Off2} = \{(\text{offset} <<1 + \text{stream}[4]) <<1 + \text{stream}[3] \text{ or (offset} <<1 + \text{stream}[4] - \text{range}) <<1 + \text{stream}[3]$$

$$\text{or } \{(\text{offset} <<1 + \text{stream}[4]) <<1 + \text{stream}[3] - \text{range}$$

$$\text{or } (\text{offset} <<1 + \text{stream}[4] - \text{range}) <<1 + \text{stream}[3] - \text{range}$$

$$\text{Off2} = \text{offset} <<2 + \text{stream}[4:3]$$

$$\text{or offset} <<2 + \text{stream}[4:3] - 2*\text{range}$$

$$\text{or offset} <<2 + \text{stream}[4:3] - 1*\text{range}$$

$$\text{or offset} <<2 + \text{stream}[4:3] - 3*\text{range}$$

Therefore, the Off2 (bin2's output) can be selected by off1 (bin1's output), yielding a faster timing than achievable using serial based architecture.

Figure 4:
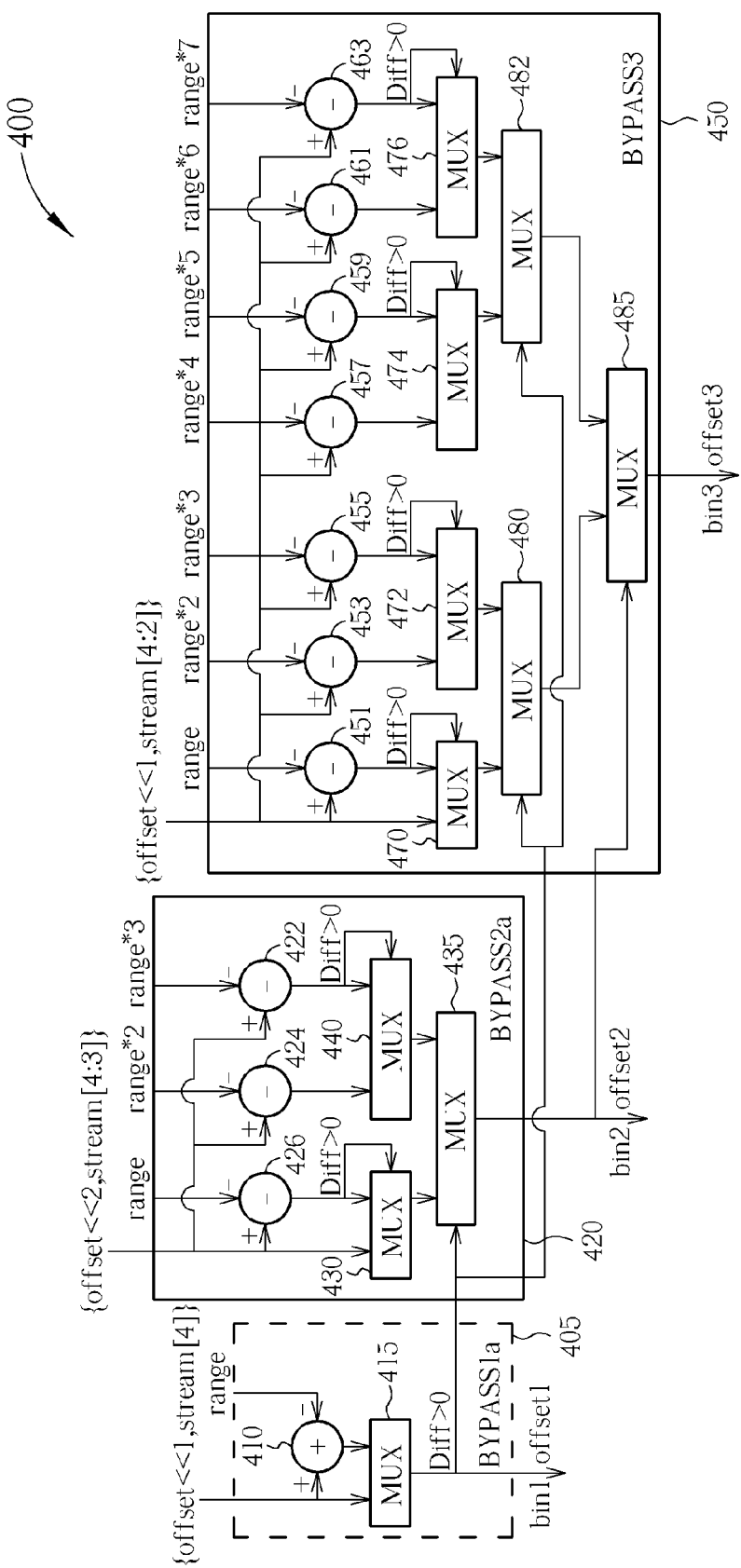
FIG. 4 shows a parallel based 3 bypass bin decoder according to some embodiments.

With this in mind, please refer now to FIG. 4 that shows a parallel based 3 bypass bin decoder 400 according to some embodiments. As shown, FIG. 4 may include a BYPASS1a module 405, a BYPASS2a module 420, and a BYPASS3 module 450. BYPASS1a module 405 comprises similar elements and functionalities as did the BYPASS1_A 305 of FIG. 3 where an adder 410 and multiplexer 415 of FIG. 4 respectively function similarly to the adder 310 and multiplexer 315 of FIG. 3 to output bin1 and offset1.

BYPASS2a module 420 of FIG. 4 also comprises elements having functions similar to those in the BYPASS2_B 350 module of FIG. 3 where adders 426, 424, and 422 respectively replace form and function of adders 365, 360, and 355 of FIG. 3. Multiplexers 430, 440, and 435 also respectively replace form and function of multiplexers 380, 385, and 390 of FIG. 3 to finally output bin2 and offset 2.

BYPASS3 module 450 is now added to improve the 2 bypass bin decoder 300 of FIG. 3 into the parallel based 3 bypass bin decoder 400 of FIG. 4. BYPASS3 module takes a first input value that includes a shifted offset value concatenated with the fourth through second elements of the bitstream. The first input is coupled to output to a first multiplexer 470, and to each of a first, second, third, fourth, fifth, sixth, and seventh adder 451, 453, 455, 457, 459, 461, 463.

The first adder 451 subtracts a 1-bit range value from the first input value and outputs a first difference to the first multiplexer 470, both as an input and as a control signal where control of the first multiplexer 470 is determined by whether the first difference is greater than a predefined value such as zero.

The second adder 453 subtracts a 2-bit range value from the first input value and outputs a second difference to a second multiplexer 472 as an input. The third adder 455 subtracts a 3-bit range value from the first input value and outputs a third difference to the second multiplexer 472, both as an input and as a control signal where control of the second multiplexer 472 is determined by whether the third difference is greater than a predefined value such as zero.

The fourth adder 457 subtracts a 4-bit range value from the first input value and outputs a fourth difference to a third multiplexer 474. The fifth adder 459 subtracts a 5-bit range value from the first input value and outputs a fifth difference to the third multiplexer 474, both as an input and as a control signal where control of the third multiplexer 474 is determined by whether the fifth difference is greater than a predefined value such as zero.

The sixth adder 461 subtracts a 6-bit range value from the first input value and outputs a sixth difference to a fourth multiplexer 476. The seventh adder 463 subtracts a 7-bit range value from the first input value and outputs a seventh difference to the fourth multiplexer 476, both as an input and as a control signal where control of the fourth multiplexer 476 is determined by whether the seventh difference is greater than a predefined value such as zero.

Outputs of the first and second multiplexers 470, 472 are each fed as inputs to a fifth multiplexer 480 which is controlled by the same signal that controls the multiplexer 435 of BYPASS2a. Outputs of the third and fourth multiplexers 474, 476 are each fed as inputs to a sixth multiplexer 482 which is also controlled by the same signal that controls the multiplexer 435 of BYPASS2a. Outputs of the fifth and sixth multiplexers 480, 482 are each fed as inputs to a seventh multiplexer 485 which is controlled by the output of the multiplexer 435 of BYPASS2a. Output of the seventh multiplexer 485 is bin3 and offset3.

Figure 5:
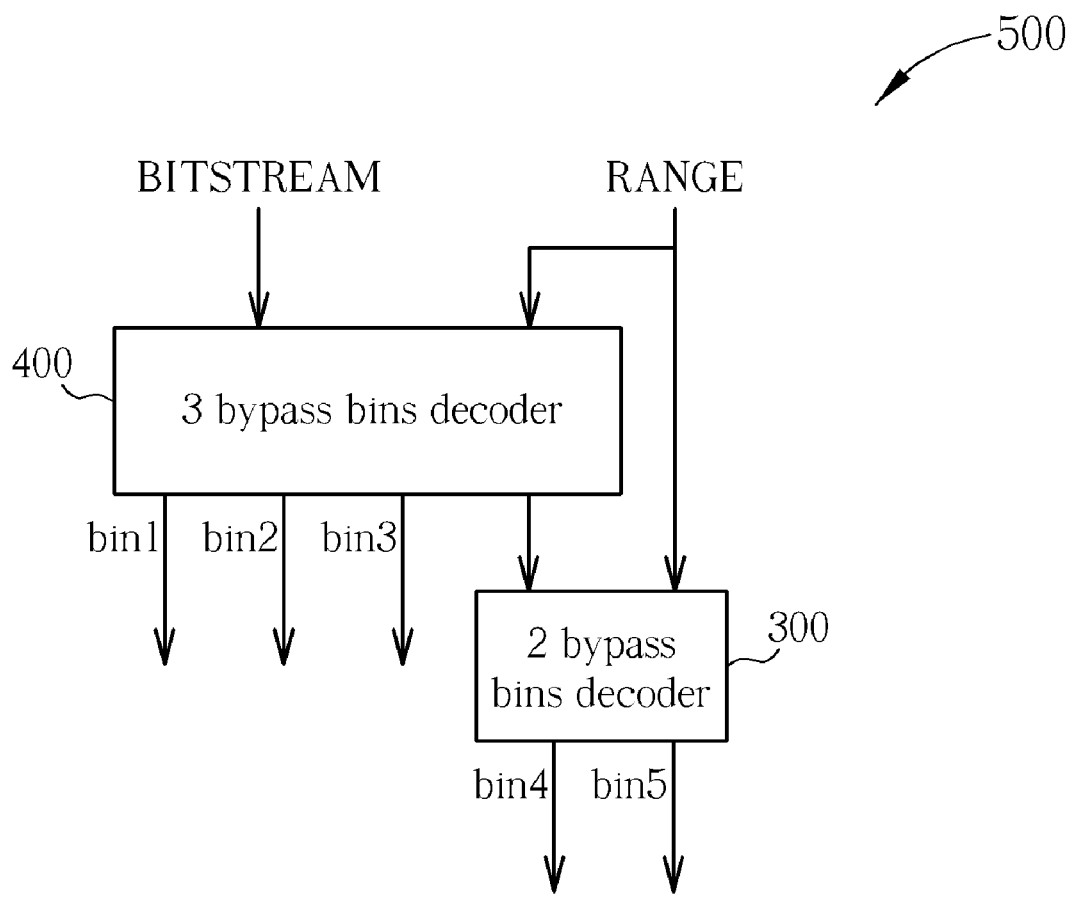
FIG. 5 is a block diagram of a 5 bypass bin decoder according to some embodiments.

Please now refer to FIG. 5, which is a block diagram of how a parallel based 5 bypass bin decoder 500 may be formed by combining the parallel based 2 bypass bin decoder of FIG. 3 with the parallel based 3 bypass bin decoder of FIG. 4.

As shown in FIG. 5, appropriate bitstream and range values may be inputted into the 3 bypass bins decoder 400, resulting in outputs of bin1, bin2, bin3, along with the shifted bitstream. The shifted bitstream and the range value are then inputted into the 2 bypass bins decoder 300 to finally yield bin4 and bin5.

A conventional bypass bin decoder is of a sequential design with a long computing path, but is easy to implement. To improve upon the long computing path, the above-described look-ahead bypass decoder is proposed. The proposed design can improve timing by about 40%. For example, a conventional 5 bin decoder requires about 6.66 ns (150 Mhz), but the proposed design requires only about 4 ns to decode 5 bins per cycle at 250 MHz (Fujitsu 90 nm) using the proposed decoder.

Those skilled in the art will readily observe that numerous modifications and alterations of the device and method may be made while retaining the teachings of the invention.

What is claimed is:

1. A parallel based 5 bypass bin CABAC decoder comprising:
 a 3 bypass bins decoder having a first input receiving a bitstream, a second input receiving range values, a first output outputting a first bypass bin, a second output outputting a second bypass bin, a third output outputting a bypass third bin, and a fourth output outputting a shifted bitstream; and
 a 2 bypass bins decoder having a third input receiving the shifted bitstream, a fourth input receiving the range values, a fifth output outputting a fourth bypass bin, and a sixth output outputting a fifth bypass bin.

2. The parallel based 5 bypass bin CABAC decoder of claim 1 wherein the 2 bypass bins decoder further comprises:
 a first circuit having the third input, a first adder, a first multiplexer, and the fifth output coupled in series; and
 a second circuit parallel to the first circuit and having the fourth input, the first adder, the first multiplexer, and the fifth output coupled in series.

3. The parallel based 5 bypass bin CABAC decoder of claim 2 wherein the 2 bypass bins decoder further comprises:
 a third circuit having the third input, a second multiplexer, a third multiplexer, and the sixth output coupled in series;
 wherein the third multiplexer is controlled by output of the first multiplexer.

4. The parallel based 5 bypass bin CABAC decoder of claim 3 wherein the 2 bypass bins decoder further comprises:
 a fourth circuit parallel to the third circuit having the fourth input, a second adder, the second multiplexer, the third multiplexer, and the sixth output coupled in series;
 wherein the second multiplexer is controlled by output of the second adder.

5. The parallel based 5 bypass bin CABAC decoder of claim 4 wherein the 2 bypass bins decoder further comprises:
 a fifth circuit parallel to the third circuit having the third input, a third adder, a fourth multiplexer, the third multiplexer, and the sixth output coupled in series; and
 a sixth circuit parallel to the third circuit having the fourth input, a fourth adder, the fourth multiplexer, the third multiplexer, and the sixth output coupled in series;
 wherein the fourth multiplexer is controlled by output of the fourth adder.

6. A parallel based 5 bypass bin CABAC decoder comprising:
 a 3 bypass bins decoder having a first input receiving a bitstream, a second input receiving range values, a first output outputting a bypass bin, a second output outputting a bypass bin, a third output outputting a bypass bin, and a fourth output outputting a shifted bitstream; and
 a 2 bypass bins decoder having a first input coupled to receive the shifted bitstream, a second input coupled to receive the range values, a first output outputting a bypass bin, and a second output outputting a bypass bin.

7. The parallel based 5 bypass bin CABAC decoder of claim 6 wherein the 3 bypass bins decoder further comprises:
 a first circuit having the first input, a first adder, a first multiplexer, and the first output coupled in series; and
 a second circuit parallel to the first circuit and having the second input, the first adder, the first multiplexer, and the first output coupled in series.

8. The parallel based 5 bypass bin CABAC decoder of claim 7 wherein the 3 bypass bins decoder further comprises:
 a third circuit having the first input, a second multiplexer, a third multiplexer, and the second output coupled in series;
 wherein the third multiplexer is controlled by output of the first multiplexer.

9. The parallel based 5 bypass bin CABAC decoder of claim 8 wherein the 3 bypass bins decoder further comprises:
 a fourth circuit parallel to the third circuit having the second input, a second adder, the second multiplexer, the third multiplexer, and the second output coupled in series;
 wherein the second multiplexer is controlled by output of the second adder.

10. The parallel based 5 bypass bin CABAC decoder of claim 9 wherein the 3 bypass bins decoder further comprises:

a fifth circuit parallel to the third circuit having the first input, a third adder, a fourth multiplexer, the third multiplexer, and the second output coupled in series; and a sixth circuit parallel to the third circuit having the second input, a fourth adder, the fourth multiplexer, the third multiplexer, and the sixth output coupled in series;

wherein the fourth multiplexer is controlled by output of the fourth adder.

11. The parallel based 5 bypass bin CABAC decoder of claim 10 wherein the 3 bypass bins decoder further comprises:

a seventh circuit having the first input, a fifth multiplexer, a sixth multiplexer, a seventh multiplexer and the third output coupled in series; and an eighth circuit parallel to the seventh circuit having the first input, a fifth adder, an eighth multiplexer, a ninth multiplexer, the seventh multiplexer, and the third output coupled in series.

12. The parallel based 5 bypass bin CABAC decoder of claim 11 wherein the third multiplexer, the fifth multiplexer, and the ninth multiplexer of the 3 bypass bins decoder are each controlled by a same signal output from the first multiplexer of the 3 bypass bins decoder.

13. The parallel based 5 bypass bin CABAC decoder of claim 12 wherein the seventh multiplexer of the 3 bypass bins decoder is controlled by output from the third multiplexer of the 3 bypass bins decoder.

14. The parallel based 5 bypass bin CABAC decoder of claim 13 wherein the 2 bypass bins decoder further comprises:

a first circuit having the first input, a first adder, a first multiplexer, and the first output coupled in series; and a second circuit parallel to the first circuit and having the second input, the first adder, the first multiplexer, and the first output coupled in series.

15. The parallel based 5 bypass bin CABAC decoder of claim 14 wherein the 2 bypass bins decoder further comprises:

a third circuit having the first input, a second multiplexer, a third multiplexer, and the second output coupled in series;

wherein the third multiplexer is controlled by output of the first multiplexer.

16. The parallel based 5 bypass bin CABAC decoder of claim 15 wherein the 2 bypass bins decoder further comprises:

a fourth circuit parallel to the third circuit having the second input, a second adder, the second multiplexer, the third multiplexer, and the second output coupled in series;

wherein the second multiplexer is controlled by output of the second adder.

17. The parallel based 5 bypass bin CABAC decoder of claim 16 wherein the 2 bypass bins decoder further comprises:

a fifth circuit parallel to the third circuit having the first input, a third adder, a fourth multiplexer, the third multiplexer, and the second output coupled in series; and a sixth circuit parallel to the third circuit having the second input, a fourth adder, the fourth multiplexer, the third multiplexer, and the sixth output coupled in series;

wherein the fourth multiplexer is controlled by output of the fourth adder.

* * * * *